(12) United States Patent
Suh

(10) Patent No.: US 9,421,689 B2
(45) Date of Patent: Aug. 23, 2016

(54) MANIPULATOR APPARATUS

(71) Applicant: ALLIED TECHFINDERS CO., LTD., Suwon-si (KR)

(72) Inventor: Kee Won Suh, Suwon-si (KR)

(73) Assignee: Allied Techfinders Co., Ltd., Suwon-si (KR)

( * ) Notice: Subject to any disclaimer, the term of this patent is extended or adjusted under 35 U.S.C. 154(b) by 104 days.

(21) Appl. No.: 14/483,664

(22) Filed: Sep. 11, 2014

(65) Prior Publication Data
US 2015/0071738 A1  Mar. 12, 2015

(30) Foreign Application Priority Data
Sep. 11, 2013  (KR) .................. 10-2013-0108786

(51) Int. Cl.
*H01L 21/677* (2006.01)
*B25J 18/02* (2006.01)

(52) U.S. Cl.
CPC ......... *B25J 18/025* (2013.01); *H01L 21/67742* (2013.01)

(58) Field of Classification Search
CPC . Y10T 74/18; Y10T 74/088; Y10T 74/18096; Y10T 74/18104; B25J 18/025; H01L 21/67742
USPC ........................................ 414/744.6
See application file for complete search history.

(56) References Cited

U.S. PATENT DOCUMENTS

| | | | | |
|---|---|---|---|---|
| 4,431,361 A * | 2/1984 | Bayne | ............... | H01L 21/67781 414/405 |
| 4,495,828 A * | 1/1985 | Iwamoto | ............ | B22D 17/2084 74/109 |
| 5,176,190 A * | 1/1993 | Miyamoto | ................ | B27C 1/12 144/114.1 |
| 6,742,977 B1 * | 6/2004 | Okayama | .......... | H01L 21/67742 118/719 |
| 8,264,187 B2 * | 9/2012 | Laceky | ................ | B25J 19/0029 318/568.11 |

* cited by examiner

*Primary Examiner* — Gerald McClain
*Assistant Examiner* — Ronald Jarrett

(57) ABSTRACT

Disclosed herein is a manipulator apparatus. The manipulator apparatus includes a jig unit provided with a manipulator. The jig unit includes a first member provided with the manipulator, a second member configured to move the first member, and a third member configured to move the second member.

8 Claims, 5 Drawing Sheets

MANIPULATOR APPARATUS

CROSS-REFERENCE TO RELATED APPLICATIONS

This application claims the benefit under 35 USC §119(a) of Korean Patent Application No. 10-2013-0108786 filed on Sep. 11, 2013, in the Korean Intellectual Property Office, the entire disclosure of which is incorporated herein by reference for all purposes.

BACKGROUND OF THE INVENTION

1. Field

The present invention relates to a manipulator apparatus which transfers a target from a first position to a second position.

2. Description of Related Art

As factories for producing a variety of products are automated, a means for transferring various kinds of targets such as glass panels, wafers, etc. to be processed or tested to desired positions is more widely used.

Manipulators are devices on which targets are placed or which grasp targets and lift them. The targets can be transferred to desired positions by moving the manipulators.

A system for transferring objects using a robot was proposed in Korean Patent Unexamined Publication No. 2010-0013364. However, in this conventional technique, a manipulator which takes up merely small installation space and is able to rapidly transfer a target was not introduced.

PRIOR ART DOCUMENT

Patent Document

Korean Patent Unexamined Publication No. 2010-0013364

SUMMARY

Accordingly, the present invention has been made keeping in mind the above problems occurring in the prior art, and an object of the present invention is to provide a manipulator apparatus which has a comparatively small size, is able to rapidly transfer a target, and is configured to increase the distance that the target can be transferred.

The technical object of the present invention is not limited to the above-mentioned object, and those skilled in this art will be able to easily understand other unmentioned objects from the following description.

In order to accomplish the above object, the present invention provides a manipulator apparatus, including a jig unit provided with a manipulator. The jig unit includes a first member provided with the manipulator, a second member configured to move the first member, and a third member configured to move the second member.

BRIEF DESCRIPTION OF DRAWINGS

The above and other objects, features and advantages of the present invention will be more clearly understood from the following detailed description taken in conjunction with the accompanying drawings, in which.

DETAILED DESCRIPTION

Figure 1:
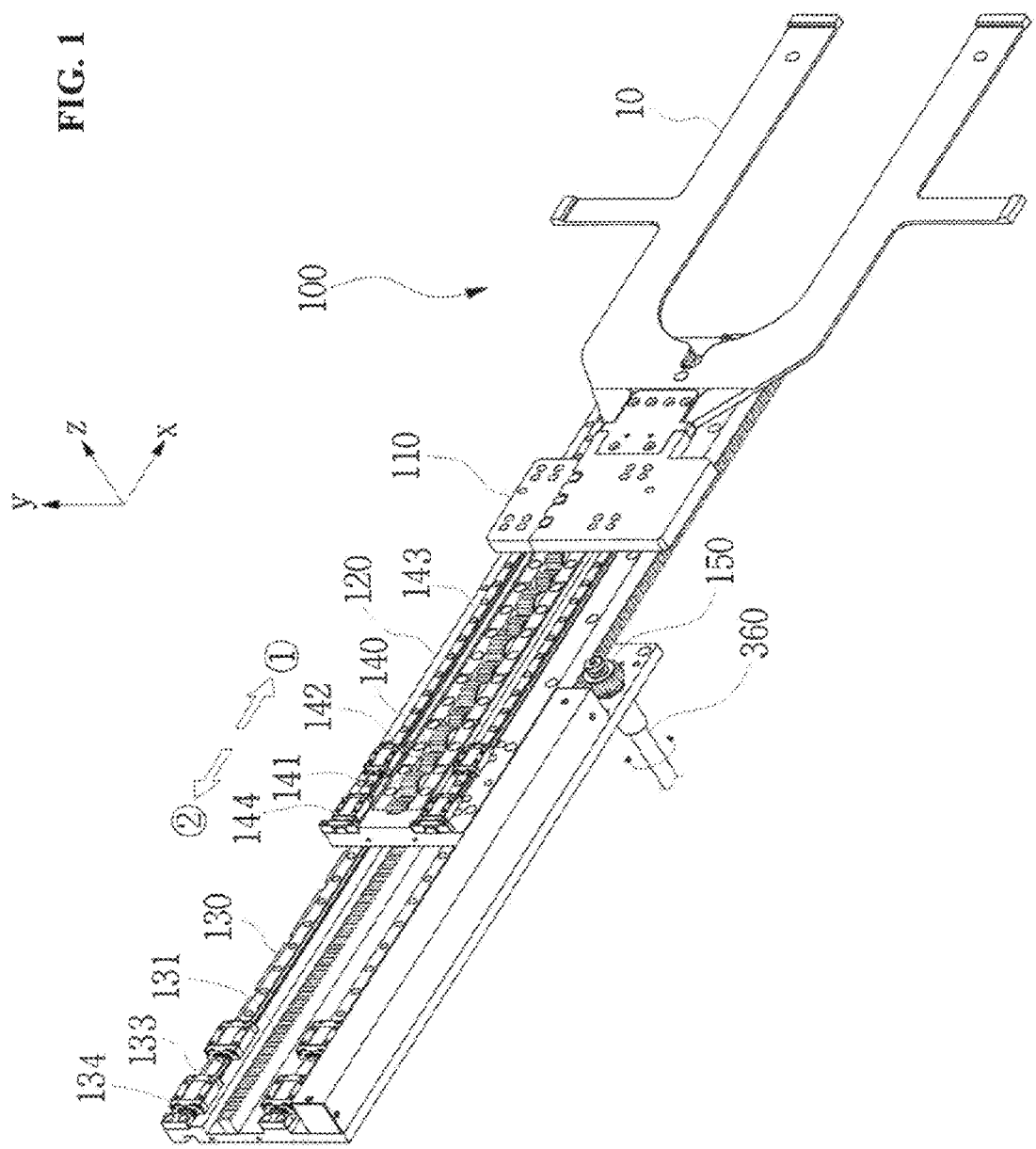
FIG. 1 is a perspective view illustrating a manipulator apparatus according to a first embodiment of the present invention.

Hereinafter, preferred embodiments of the present invention will be described in detail with reference to the attached drawings. The size, the shape, etc. of each element may be exaggeratedly expressed in the drawings for the sake of understanding the present invention. The terms and words used for elements in the description of the present invention have been determined in consideration of the functions of the elements in the present invention. The terms and words may be changed depending on the intention or custom of users or operators, so that they must be defined based on the whole content of the specification of the present invention.

FIG. 1 is a perspective view illustrating a manipulator apparatus according to a first embodiment of the present invention.

As shown in FIG. 1, the manipulator apparatus includes a jig unit 100 which is provided with a manipulator 10.

In the first embodiment of the present invention, the manipulator 10 may be a means for supporting a target, for example, a substrate, to be transferred or for picking up or grasping the target. In the drawings, the manipulator 10 is illustrated as being a support that is configured such that the target to be transferred can be placed on the support on the xy plane in the xyz space. The target to be transferred may be a glass panel, a wafer or the like.

The jig unit 100 moves the manipulator 10 to transfer the target placed on the manipulator 10.

The jig unit 100 is configured to have a multistage sliding structure in such a way that three or more members are placed on top of one another so as to be movable with respect to each other. In this embodiment, the jig unit 100 includes a first member 110, a second member 120 and a third member 130.

The manipulator 10 is installed on the first member 110. Here, the manipulator 10 can move along with the first member 110.

The second member 120 can move the first member 110. In the drawings, the first member 110 is illustrated as being moved by the second member 120 in a positive or negative direction along the x-axis. For the sake of description, the positive direction along the x-axis is designated as a first direction ①, and the negative direction along the x-axis is designated as a second direction ②.

The third member 130 can move the second member 120. In the drawings, the second member 120 is illustrated as being moved by the third member 130 in the first direction ① or the second direction ②.

According to the above-mentioned construction, if the length of each member is the same and is 'M', when the members completely overlap each other, the length of the manipulator apparatus (other than the manipulator 10) becomes 'M' with respect to the x-axis direction. When the members extend to the maximum, the overall length of the manipulator apparatus becomes '3M'. If only two members are present, the length of the manipulator apparatus that is in the fully collapsed state is 'M' in the same manner as that of the manipulator apparatus including the three members, but the fully extended length thereof is '2M' which is shorter than that of the manipulator apparatus including the three members. Hence, in terms of the distance that the manipulator 10 provided on the first member 110 can move, it is also obvious that the manipulator apparatus including the three members be greater than the manipulator apparatus including the two members. As a result, compared to the apparatus using a double stage structure to move the manipulator, the present invention can make the distance that the manipulator 10 can move longer if the members have the same length as that of the double stage structure, or make the length of each member shorter if the distance that the manipulator 10 can move is the same as that of the double stage structure.

As such, the above-mentioned construction can provide a relatively long transfer distance while reducing a required installation space. Therefore, the manipulator apparatus according to the present invention having the above-mentioned construction can transfer the target over a relatively long distance while taking up a comparatively small space in a transfer section in which the target is transferred.

The manipulator apparatus may be configured in such a way that a drive means for moving the second member 120 is provided on the third member 130, and a drive means for moving the first member 110 is provided on the second member 120. Each drive means may be a motor or the like.

However, it is preferable to reduce the number of drive means. For this, a link unit that is linked to the first member 110 and the third member 130 is provided on the second member 120. In this embodiment, the link unit may be configured such that it moves the first member 110 and the third member 130 in the opposite directions to each other. According to this construction, even if a drive means is provided on only one of any of the members, all of the members can be moved.

Figure 2:
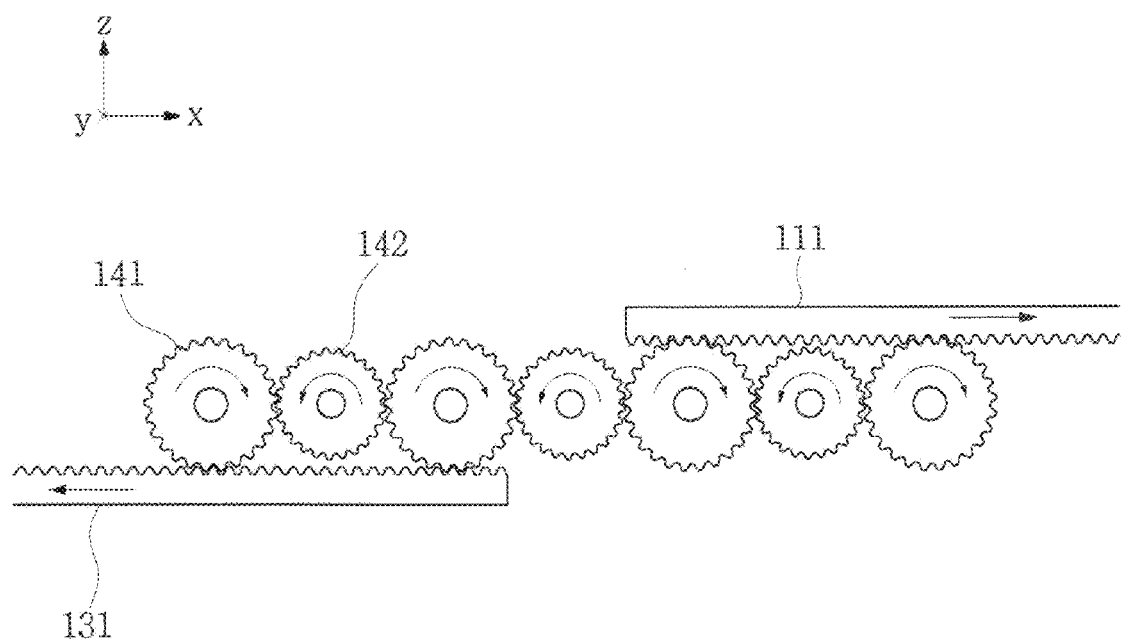
FIG. 2 is a schematic view showing a link unit of the manipulator apparatus according to the present invention.

For example, as shown in FIG. 2, the link unit may be a pinion gear unit 140.

FIG. 2 is a schematic view showing the link unit of the manipulator apparatus according to the present invention.

In the first embodiment, the first member 110, the second member 120 and third member 130 are successively placed on top of one another. Extending in the direction of movement of the manipulator 10, a first rack gear 111 is provided on the first member 110. Furthermore, a second rack gear 131 extending in the direction of the movement of the manipulator 10 is provided on the third member 130. The first and second rack gears 111 and 131 face the second member 120.

Provided in the second member 120, the pinion gear 140 engages at an upper portion thereof with the first rack gear 111 and engages at a lower portion thereof with the second rack gear 131.

The pinion gear unit 140 that is the link unit moves the first rack gear 111 and the second rack gear 131 in the opposite directions to each other, thereby moving the first member 110 and the third member 130 in the opposite directions to each other.

The pinion gear unit 140 is an element which engages with the first member 110 and the third member 130 and may comprise a plurality of circular gears which are arranged in the direction of movement of the manipulator 10 and engage with each other.

In detail, the pinion gear unit 140 may include first gears 141 and second gears 142 which engage with each other and are alternately arranged in the movement direction (x-axis direction) of the manipulator 10. The first gears 141 have a larger diameter than that of the second gears 142. Thereby, the first and second gears 141 and 142 can be installed in the second member 120 in such a way that only the first gears 141 make contact with the first and third members 110 and 130 while the second gears 142 are spaced part from the first and third members 110 and 130.

According to this construction, the first gears 141 which engage with the first and third members 110 and 130, in detail, with the first and second rack gears 111 and 131, rotate in the same direction. Referring to FIG. 2, it can be understood that all of the first gears 141 are rotated in the same clockwise direction by the second gears 142 each of which is disposed between the corresponding two adjacent first gears 141. Although all of the second gears 142 rotate in the counterclockwise direction, they do not interrupt the first and second rack gears 111 and 131 to be moved by the first gears 141, because the second gears 142 have a smaller diameter than that of the first gears 141 and are spaced apart from the first rack gear 111 and the second rack gear 131 by predetermined distances.

Based on the above-mentioned construction, in an embodiment, the drive means may be configured such that it rotates the pinion gear unit 140. For instance, if the drive means rotates the first gears 141 in the clockwise direction, the first rack gear 111 is moved in the first direction ①, and the second rack gear 131 is moved in the second direction ②.

In another embodiment, the drive means may be configured such that it moves the second and third members 120 and 130 relative to each other. To embody such relative movement of the second and third members 120 and 130, the drive means may be directly installed on the second member 120 or the third member 130. Alternatively, a power transmission unit 150 including a gear or belt may be provided on the second member 120 or the third member 130, and the drive means may transmit drive force to the power transmission unit 150.

For example, as shown in FIG. 1, the power transmission unit 150, which receives drive force from the drive means, may be provided on the third member 130. In the embodiment of FIG. 1, the power transmission unit 150 includes a gear which is rotated by a second connection shaft 360 coupled to the drive means. In this case, corresponding to the power transmission unit 150, a means for receiving drive force from the power transmission unit 150 may be provided on the second member 120. In the embodiment of FIG. 1, a separate rack gear is provided on the second member 120 as the means for receiving the drive force.

When the power transmission unit 150 moves the second member 120 in the first direction ① with respect to the third member 130, the first gears 141 that engages with the second rack gear 131 of the third member 130 rotate in the clockwise direction and thus pushes the first member 110 in the first direction ①. That is, when the second member 120 is moved by the power transmission unit 150, the first member 110 is also moved by the link unit.

In another embodiment, the drive means may be configured such that it moves the first and second members 110 and 120 relative to each other. In this case, when the second member 120 is moved in the second direction ② with respect to the first member 110, the first gears 141 that engage with the first rack gear 111 of the first member 110 rotate in the clockwise direction and thus pushes the third member 130 in the second direction ②.

Meanwhile, a guide block 134 of the third member 130 is coupled to a lower surface of the second member 120 and is linearly movably connected to a linear guide 133 mounted to the third member 130. Thereby, the second member 120 can be linearly moved relative to the third member 130.

Furthermore, a guide block 144 of the second member 120 is coupled to a lower surface of the first member 110 and is linearly movably connected to a linear guide 143 mounted to the second member 120. Thereby, the second member 120 can be linearly moved relative to the third member 130. Thereby, the first member 110 can be linearly moved relative to the second member 120.

Described hitherto are several embodiments of the construction in which when drive force is transmitted from the drive means to any one of the members or the pinion gear unit 140, the other members to which the drive force is not directly applied are also moved by the pinion gear unit 140, that is, the link unit. Although for the sake of description the directions of movement of the members have been differently explained in each embodiment, they substantially refer to the same operation. For instance, if the position of the third member 130 is fixed in place with respect to the direction of movement of the manipulator 10, the directions of movement of the first member 110 and the second member 120 relative to the third member 130 are the same.

Figure 3A:
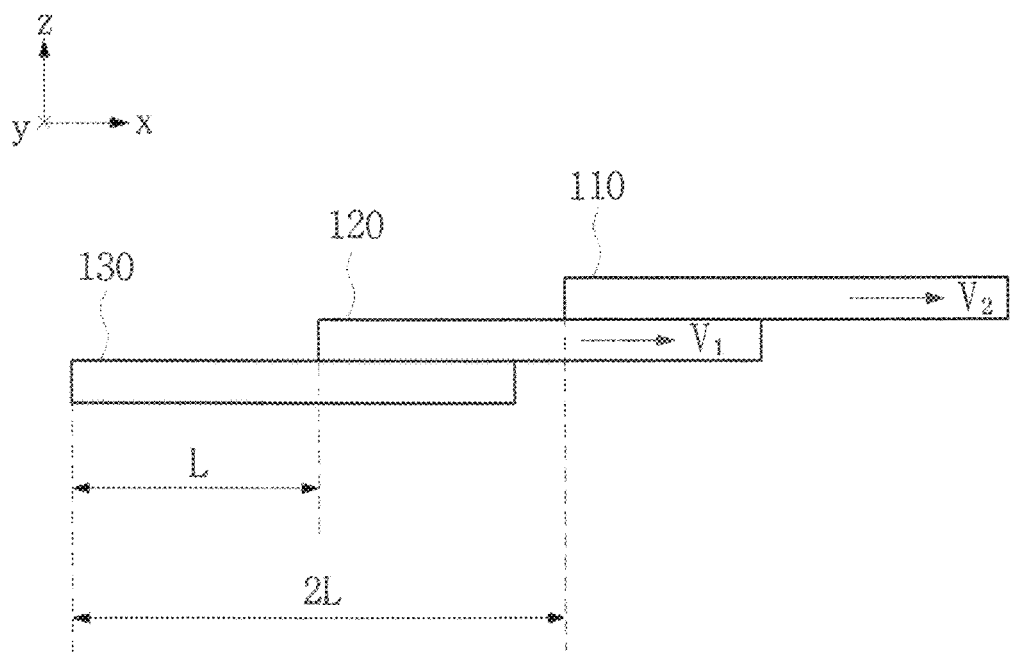
FIGS. 3A and 3B are schematic views showing the operation of the manipulator apparatus according to the present invention.
Figure 3B:
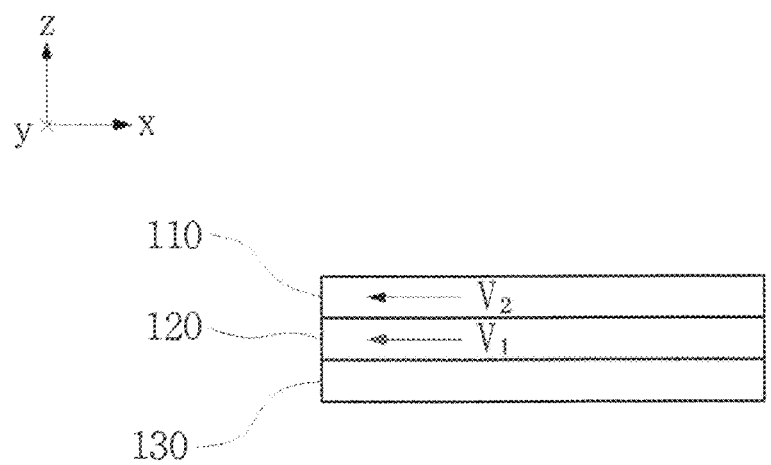

FIGS. 3A and 3B are schematic views showing the operation of the manipulator apparatus according to the present invention.

As described with reference to FIG. 2, when the second member 120 is moved by the line unit in the first direction with respect to the third member 130, the first member 110 is also moved in the first direction with respect to the second member 120. This state is shown in FIG. 3A.

Contrary to this, when the second member 120 is moved by the line unit in the second direction with respect to the third member 130, the first member 110 is also moved in the second direction with respect to the second member 120. This state is shown in FIG. 3B.

According to the link unit described above, the speed V2 of the first member 110 relative to the second member 120 may be the same as the speed V1 of the second member 120 relative to the third member 130. However, the speed V2 of the first member 110 relative to the third element 130 is two times the speed V1 of the second member 120 relative to the third member 130. This means that the manipulator 10 can be moved at a speed that is double the driving speed of the link unit. Therefore, using the drive means operated at a first speed, the manipulator apparatus according to the present invention can move the manipulator 10 at a second speed that is higher than the first speed. If the pinion gear unit 140 is used as the link unit, the manipulator 10 can be precisely transferred to a desired position because a problem such as a belt sagging phenomenon can be prevented.

Furthermore, in the present invention, if the distance that the second member 120 moves based on the third member 130 is L, the distance that the first member 110 moves becomes 2L. Therefore, the manipulator 10 can be moved by 2L by providing only drive force with which the second member 120 is moved with respect to the third member 130 by L. Thus, the time for which the drive means is operated can be reduced, thereby reducing energy consumption.

Figure 4:
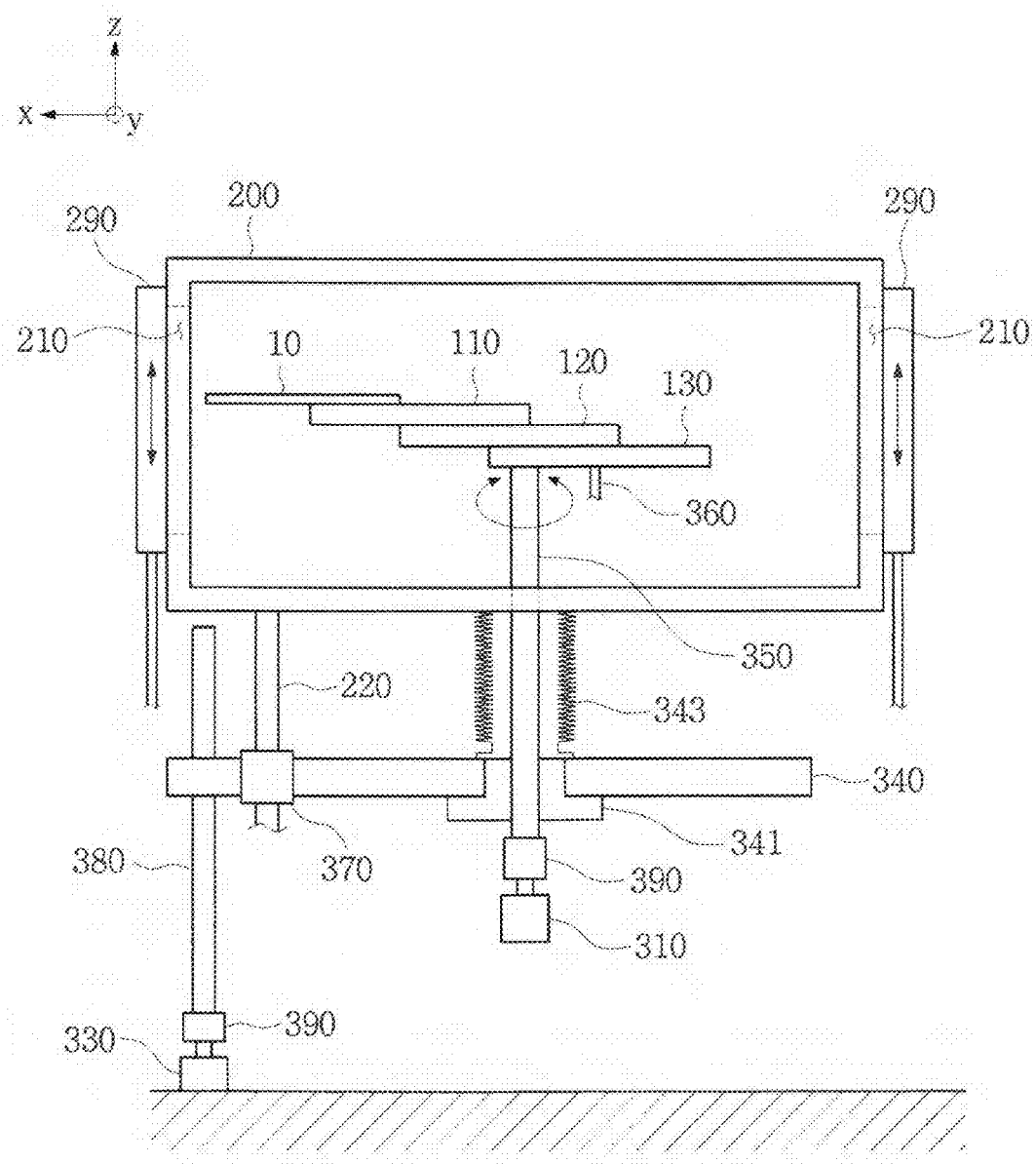
FIG. 4 is a schematic view illustrating a manipulator apparatus according to a second embodiment of the present invention.

FIG. 4 is a schematic view illustrating a manipulator apparatus according to a second embodiment of the present invention.

The manipulator apparatus illustrated in FIG. 4 includes a jig unit 100, a chamber unit 200 and a drive unit.

Preferably, a link unit of the jig unit 100 is made of nonmetallic material so as to prevent particles from being generated in the chamber unit 200. More preferably, as well as the link unit, all elements such as bearings, etc. constituting the jig unit 100 are made of nonmetallic material. In the description of the first embodiment, the example in which the power transmission unit 150 is used rather than a drive means being directly installed in each member has been illustrated. The reason for this is to prevent fine particles from entering the chamber when the drive means is operated. For reference, nonmetallic material may be ceramic, engineering plastic or the like.

The drive unit according to the second embodiment refers to the drive means mentioned above and may be installed outside the chamber unit 200 by using the power transmission unit 150. In this way, particles generated from the drive unit can be prevented from undesirably entering the chamber unit 200.

The chamber unit 200 has therein a space to receive the jig unit 100. The chamber unit may be a vacuum chamber or a chamber which creates an atmosphere containing various kinds of gases.

Openings 210 are respectively formed in opposite sides of the chamber unit 200 so that the target to be transferred enters or exits the chamber 200 through the openings 210. Gate valves 290 are provided on the chamber unit 200, and each gate valve 290 is an opening and closing unit which opens or closes the corresponding opening 210 under the control of a control unit (not shown).

Meanwhile, to prevent the target to be transferred from being damaged, it is necessary for the jig unit 100 to have to move in a direction perpendicular to the direction of movement of the manipulator 10. For example, to grasp the target that has been outside the chamber and move it into the chamber, if the jig unit 100 pulls the target as it is, the bottom of a support that has supported the target may scratch the target. To prevent this, the jig unit 100 has to lift the target from the bottom of the support after having grasped the target. For this, the jig unit 100 must be able to move in the direction perpendicular to the direction of movement of the manipulator 10. To achieve the above purpose, a jig moving unit may be used.

The jig moving unit functions to move the jig unit 100 in the direction perpendicular to the direction of movement of the manipulator 10. The jig moving unit is connected to the third member 130 of the jig unit 100 that is fixed in place with respect to the direction of movement of the manipulator 10.

For example, the jig moving unit includes a first connection shaft 350, a second connection shaft 360, a first drive unit 310, a second drive unit and a third drive unit 330.

Passing through the bottom of the chamber unit 200, the first connection shaft 350 is connected to the jig unit 100. In detail, the first connection shaft 350 is connected to the third member 130 of the jig unit 100 and functions to support the jig unit 100.

Disposed outside the chamber unit 200, the first drive unit 310 rotates the first connection shaft 350, thus rotating the jig unit 100. As shown in FIG. 4, the openings 210 are formed in the respective opposite side surfaces of the chamber. The jig unit 100 receives the target from the left opening 210 and transfers the target out of the chamber through the right opening 210. In order to conduct the above-mentioned operation, the jig unit 100 can be rotated in the chamber by the first connection shaft 350 and the first drive unit 310.

The third drive unit 330 moves the first connection shaft 350 and the first drive unit 310 in the direction (z-axis direction) perpendicular to the direction of movement of the manipulator 10. There are many ways the third drive unit 330 can move the first connection shaft 350 and the second drive unit in the z-axis direction.

For example, the jig moving unit may includes a base 340 which moves in the z-axis direction along with the first connection shaft 350 and the first drive unit 310. In this case, the third drive unit 330 can move the first connection shaft 350 and the first drive unit 310 in the z-axis direction in a way of moving the base 340 in the z-axis direction. To make it possible for the base 340 to move in the z-axis direction, a guide 220 extending a predetermined length in the z-axis direction is provided, and a guide bushing 370 which moves along the guide 220 is provided on the base 340. The guide 200 may extend from the chamber unit in the z-axis direction. Alternatively, the guide 200 may extend in the z-axis direction from an element on which the third drive unit 330 is installed.

In this embodiment, the third drive unit 330 uses the ball screw 380 to move the base 340 in the z-axis direction. The third drive unit 330 is connected to the ball screw 380 by a coupling 390. Furthermore, a coupling 390 is used for connection of the first drive unit 310 to the first connection shaft 350.

Meanwhile, to prevent a hole formed in the bottom of the chamber unit 200 for installation of the first connection shaft 350 from causing leaking of gas from the chamber or breaking the vacuum state in the chamber, a bellows tube 343 is provided between the hole and the first drive unit 310. If the base 340 is provided, the bellows tube 343 may be installed between the hole and the base 340.

Furthermore, a bearing 341 is provided in the base 340 for use in rotating the first connection shaft 350. An O-ring (not shown) may be installed in the bearing 341 so as to prevent gas in the chamber from leaking. Although, in the drawing, the first drive unit 310 has been illustrated as being spaced apart from the base 340, it is preferable that the first drive unit 310 be connected to the base 340 so that the first connection shaft 350 can rotate based on the base 340 functioning as a point of support.

Passing the bottom of the chamber unit 200, the second connection shaft 360 is connected to the jig unit 100 in the same manner as that of the embodiment of FIG. 1 and thus is able to move the members of the jig unit 100.

The second drive unit (not shown) is disposed outside the chamber unit 200 and provides drive force to the members of the jig unit 100 via the second connection shaft 360.

In the same manner as the first connection shaft 350 and the first drive unit 310, the second connection shaft 360 and the second drive unit can also move in the direction perpendicular to the direction of movement of the manipulator 10. Such movement can be embodied by the third drive unit 330. The second drive unit may be installed on the based 340.

Figure 5:
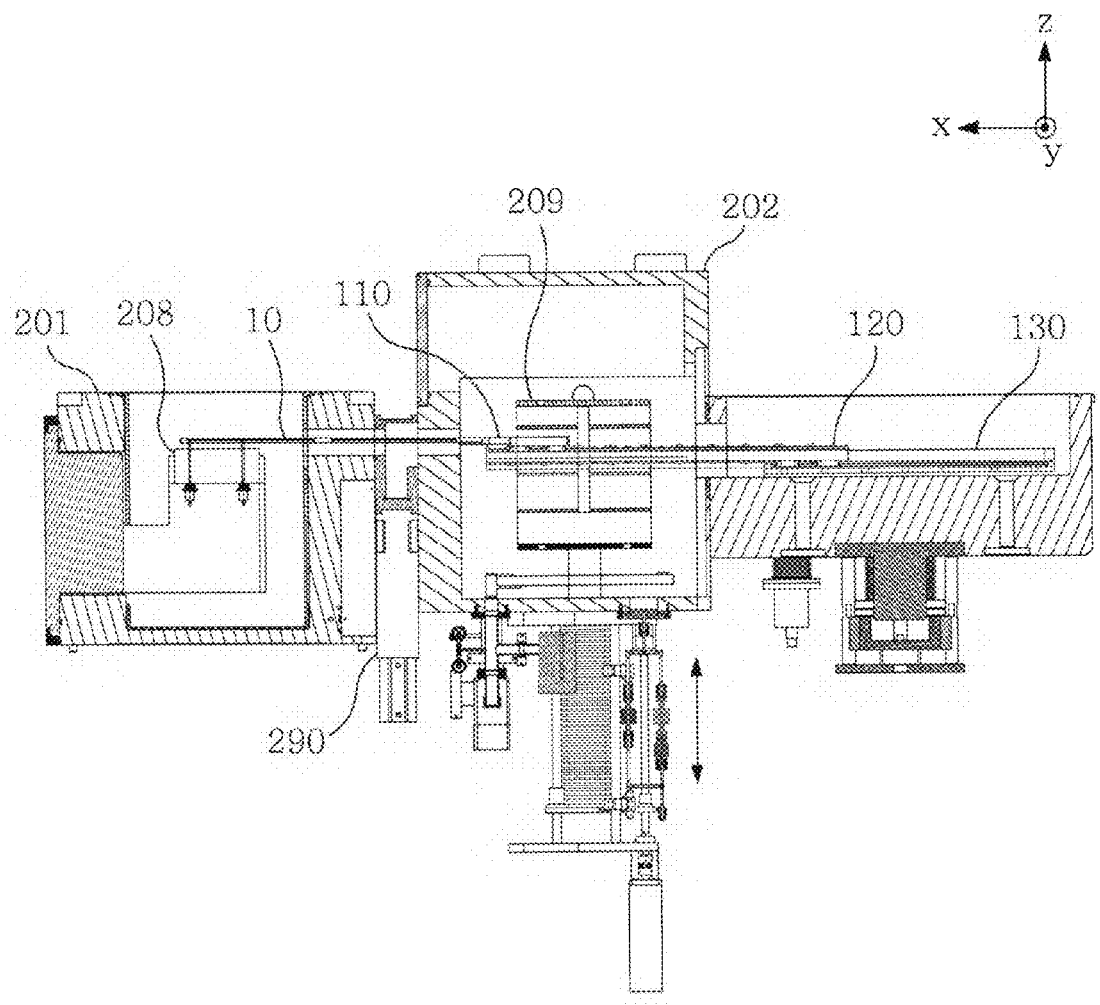
FIG. 5 is a schematic view illustrating a manipulator apparatus according to a third embodiment of the present invention.

FIG. 5 is a schematic view illustrating a manipulator apparatus according to a third embodiment of the present invention.

The manipulator apparatus according to the third embodiment includes a chamber unit 200, which has a processing chamber 201 and a preparation chamber 202.

The processing chamber 201 is a chamber in which a target to be transferred is processed by plasma. The processing chamber 201 includes a chuck unit 208 on which the target is placed.

The target awaiting plasma processing is located in the preparation chamber 202. Typically, a jig unit 100 is disposed in a transfer chamber, which is separately provided from the preparation chamber 202.

However, in the embodiment of FIG. 5, the target and the jig unit 100, which transfers the corresponding target, can be disposed together in the preparation chamber 202.

According to this construction, it is unnecessary to separately provide the transfer chamber in which the jig unit 100 is located. Furthermore, because the transfer chamber is not required, a gate valve disposed between the transfer chamber and the preparation chamber is also not required. In addition, it is also unnecessary to install, in the transfer chamber, a pumping means for regulating pressure between the processing chamber 201 and the preparation chamber 202.

The jig unit 100 is disposed at a first position in the preparation chamber 202.

The target that is in the preparation chamber 202 is disposed at a second position.

With respect to a direction of movement of the jig unit 100, the second position corresponds to the position of a loading unit 209 that receives the target to be transferred.

The target that is processed in the processing chamber 110 is disposed at a third position. The third position corresponds to the position of the chuck unit 208 with respect to the direction of movement of the jig unit 100.

The second position is disposed between the first position and the third position. The jig unit 100, specifically, the manipulator 10, reciprocates between the first position and the third position via the second position. This purpose can be achieved by the jig unit 100, described above, having the multistage sliding structure including the first member 110, the second member 120 and the third member 130.

As described above, a manipulator apparatus according to the present invention has a multistage sliding structure so that the distance between a position of a manipulator when the apparatus is in a collapsed state and a position of the manipulator when it is in an extended state can be increased.

Thereby, given a relatively small size, the manipulator apparatus can transfer a target over a comparatively long distance.

Furthermore, by virtue of having the multistage sliding structure, the manipulator apparatus according to the present invention can rapidly transfer the target.

In addition, a pinion gear unit is provided as a link unit for use in sliding the members of the multistage sliding structure in such a way that the members are interlocked with each other. Therefore, the target can be precisely transferred to a designed position.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A manipulator apparatus, comprising:
 a jig unit provided with a manipulator, the jig unit comprising:
  a first member provided with the manipulator;
  a second member configured to move the first member; and a third member configured to move the second member,
 wherein the first member, the second member and the third member are successively placed on top of one another, and the first member is provided with a first rack gear extending in a direction of movement of the manipulator, and the third member is provided with a second rack gear extending in the direction of movement of the manipulator,
 wherein a pinion gear unit is provided at the second member which is between the first member and the third member, and the pinion gear unit includes first gears and second gears which engage with each other and are alternately arranged in the movement direction of the manipulator,
 wherein the first gears are arranged at a position to engage with the first rack gear or the second rack gear,
 wherein one of the first gears arranged at one side of the pinion gear unit is engaged with the first rack gear, and another of the first gears arranged at another side of the pinion gear unit is engaged with the second rack gear, wherein all the first gears are configured to rotate in the same clockwise direction at the same first rotational speed, when each of the second gears is disposed between two corresponding adjacent first gears, wherein all the second gears are configured to rotate in the same counterclockwise direction at the same second rotational speed, and wherein all the second gears are spaced apart from the first rack gear and the second rack gear.

2. The manipulator apparatus as set forth in claim 1, wherein:

based on the third member, a direction of movement of the first member is equal to a direction of movement of the second member; and a speed of the first member relative to the second member is equal to a speed of the second member relative to the third member.

3. The manipulator apparatus as set forth in claim 1, wherein:

the second member is provided with a link unit linked both to the first member and to the third member, wherein a position of the third member is fixed in place with respect to a direction of movement of the manipulator; and the third member is provided with a power transmission unit, the power transmission unit providing drive force to the second member to move the second member, wherein when the second member is moved by the power transmission unit, the first member is moved by the link unit.

4. The manipulator apparatus as set forth in claim 1, further comprising:

a chamber unit in which the jig unit is installed, wherein the second member is provided with a link unit linked both to the first member and to the third member, the link unit being made of nonmetallic material to prevent particles from being generated in the chamber unit.

5. The manipulator apparatus as set forth in claim 1, further comprising:

a chamber unit in which the jig unit is installed; and a drive unit providing drive force to the jig unit so that the first, second and third members of the jig unit are moved by the drive force, wherein the drive unit is disposed outside the chamber unit to prevent particles from being generated in the chamber unit.

6. The manipulator apparatus as set forth in claim 1, further comprising:

a jig moving unit provided to move the jig unit in a direction perpendicular to a direction of movement of the manipulator, the jig moving unit being connected to the third member.

7. The manipulator apparatus as set forth in claim 1, further comprising:

a chamber unit in which the jig unit is installed; and a jig moving unit provided to move the jig unit in a direction perpendicular to a direction of movement of the manipulator, the jig moving unit comprising:

a first connection shaft connected to the jig unit through a surface of the chamber unit;

a first drive unit disposed outside the chamber unit, the first drive unit rotating the first connection shaft so that the jig unit is rotated by the first connection shaft; and a third drive unit moving the first connection shaft and the first drive unit in the direction perpendicular to the direction of movement of the manipulator.

8. The manipulator apparatus as set forth in claim 1, further comprising:

a chamber unit in which the jig unit is installed; and a jig moving unit provided to move the jig unit in a direction perpendicular to a direction of movement of the manipulator, the jig moving unit comprising:

a second connection shaft connected to the jig unit through a surface of the chamber unit, the second connection shaft moving the first, second and third members of the jig unit;

a second drive unit disposed outside the chamber unit, the second drive unit providing drive force to the first, second and third members through the second connection shaft; and a third drive unit moving the second connection shaft and the second drive unit in the direction perpendicular to the direction of movement of the manipulator.

* * * * *